(12) United States Patent
Zhao et al.

(10) Patent No.: US 12,520,700 B2
(45) Date of Patent: Jan. 6, 2026

(54) ARRAY SUBSTRATE AND DISPLAY DEVICE

(71) Applicant: BOE Technology Group Co., Ltd., Beijing (CN)

(72) Inventors: Dejiang Zhao, Beijing (CN); Xue Dong, Beijing (CN); Wei Huang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 451 days.

(21) Appl. No.: 17/920,735

(22) PCT Filed: May 7, 2021

(86) PCT No.: PCT/CN2021/092189
§ 371 (c)(1),
(2) Date: Oct. 21, 2022

(87) PCT Pub. No.: WO2022/033086
PCT Pub. Date: Feb. 17, 2022

(65) Prior Publication Data
US 2023/0247890 A1 Aug. 3, 2023

(30) Foreign Application Priority Data

Aug. 11, 2020 (CN) .......................... 202010803661.3

(51) Int. Cl.
*H10K 59/80* (2023.01)
*H10K 59/122* (2023.01)
(52) U.S. Cl.
CPC ..... *H10K 59/80516* (2023.02); *H10K 59/122* (2023.02); *H10K 59/80518* (2023.02)

(58) Field of Classification Search
CPC ........... H10K 59/353; H10K 59/80515–80516
See application file for complete search history.

(56) References Cited

U.S. PATENT DOCUMENTS 10,211,269 B2   2/2019  Shirahata et al.
2002/0154257 A1*  10/2002  Iijima .................. G02F 1/1343
                                                              349/67
(Continued)

FOREIGN PATENT DOCUMENTS

CN    101800240 A    8/2010
CN    103329625 A    9/2013
(Continued)

OTHER PUBLICATIONS

CN202010803661.3 first office action.
PCT/CN2021/092189 international search report.

*Primary Examiner* — Eric K Ashbahian
(74) *Attorney, Agent, or Firm* — IPro, PLLC

(57) ABSTRACT

A sub pixel includes an active layer, a gate insulating layer, a gate, an interlayer insulating layer, a source-drain layer, a first planarization layer, and an anode. The anode includes: a reflection layer located on the side of the first planarization layer away from the base substrate and including reflection parts arranged at intervals; a second planarization located on the side of the reflection layer away from the base substrate and covers the reflection layer and the base substrate; and a first transparent electrode layer located on the side of the second planarization layer away from the base substrate and includes first electrodes arranged at intervals. There is at least an overlapping area between orthographic projections of the first electrodes on the base substrate and orthographic projections of the reflection parts on the base substrate in a same sub-pixel.

20 Claims, 8 Drawing Sheets

(56) References Cited

U.S. PATENT DOCUMENTS

| | | |
|---|---|---|
| 2010/0200875 A1 | 8/2010 | Takei |
| 2013/0299808 A1 | 11/2013 | Sugimoto et al. |
| 2014/0239272 A1 | 8/2014 | Kim |
| 2016/0225828 A1* | 8/2016 | Lee ................. H10K 50/826 |
| 2017/0012230 A1 | 1/2017 | Yan |
| 2017/0141341 A1 | 5/2017 | Liao et al. |
| 2018/0226454 A1* | 8/2018 | Liu ................. H10K 59/124 |
| 2018/0261794 A1* | 9/2018 | Choi ................ H10K 59/123 |
| 2020/0174268 A1* | 6/2020 | Kim ................. G03H 1/0005 |
| 2020/0303472 A1* | 9/2020 | Lou ................. H10K 59/879 |
| 2021/0013279 A1* | 1/2021 | Lin .............. H10K 59/80518 |
| 2021/0091152 A1 | 3/2021 | Yang et al. |
| 2022/0216447 A1 | 7/2022 | Liu et al. |

FOREIGN PATENT DOCUMENTS

| | | |
|---|---|---|
| CN | 104009186 A | 8/2014 |
| CN | 104617231 A | 5/2015 |
| CN | 105097830 A | 11/2015 |
| CN | 110112180 A | 8/2019 |
| CN | 110610975 A | 12/2019 |
| CN | 210467891 U | 5/2020 |
| CN | 111900267 A | 11/2020 |

\* cited by examiner

ARRAY SUBSTRATE AND DISPLAY DEVICE

CROSS-REFERENCE OF RELATED APPLICATIONS

The present application is a national phase entry under 35 U.S.C. § of International Application No. PCT/CN2021/092189, filed on May 7, 2021, which claims the priority of Chinese Patent Application No. 202010803661.3, filed with the China National Intellectual Property Administration on Aug. 11, 2020 and entitled "Array Substrate and Display Device", the entire contents of which are hereby incorporated by reference.

FIELD

The disclosure relates to the field of display technology, and in particular, to an array substrate and a display device.

BACKGROUND

The electroluminescent diodes, such as Organic Light Emitting Diode (OLED), Quantum Dot Light Emitting Diode (QLED), etc., have the advantages of self-luminescence and low energy consumption, and are one of hot spots in the application research field of electroluminescent display devices.

BRIEF SUMMARY

An array substrate according to an embodiment of the disclosure includes:
a base substrate including a plurality of sub-pixels; wherein at least one of the plurality of sub-pixels includes:
an active layer, located on a side of the base substrate;
a gate insulating layer, located on a side of the active layer away from the base substrate;
a gate, located on a side of the gate insulating layer away from the base substrate;
an interlayer insulating layer, located on a side of the gate away from the base substrate;
a source-drain layer, located on a side of the interlayer insulating layer away from the base substrate;
a first planarization layer, located on a side of the source-drain layer away from the base substrate; and
an anode, located on a side of the first planarization layer away from the base substrate;
wherein the anode includes:
a reflection layer, located on the side of the first planarization layer away from the base substrate and including a plurality of reflection parts arranged at intervals;
a second planarization layer, located on a side of the reflection layer away from the base substrate and covering the reflection layer and the base substrate;
a first transparent electrode layer, located on a side of the second planarization layer away from the base substrate and including a plurality of first electrodes arranged at intervals; wherein there is at least an overlapping area between orthographic projections of the first electrodes on the base substrate and orthographic projections of the reflection parts on the base substrate in the same sub-pixel.

In some embodiments, a thickness of the first transparent electrode layer in a direction perpendicular to a plane where the base substrate is located is 8 to 40 nm; and/or the array substrate further includes: a pixel defining layer located on a side of the first transparent electrode layer away from the base substrate, wherein an orthographic projection of the pixel defining layer on the base substrate covers at least a first gap between orthographic projections of reflection parts in two adjacent rows of sub-pixels on the base substrate and a second gap between orthographic projections of first electrodes in two adjacent rows of sub-pixels on the base substrate.

In some embodiments, the first electrode includes a plurality of first sub-electrodes arranged at intervals; wherein orthographic projections of the first sub-electrodes on the base substrate overlap respectively with the orthographic projections of the reflection parts on the base substrate in the same sub-pixel;
the openings expose portions in the first sub-electrodes that overlap with the reflection parts.

In some embodiments, the reflection part includes a plurality of reflective conductive parts arranged at intervals; wherein an orthographic projection of one of the first sub-electrodes on the base substrate overlaps with an orthographic projection of one of the reflective conductive parts on the base substrate; or
the orthographic projections of the reflection parts on the base substrate cover orthographic projections of the openings on the base substrate in the same sub-pixel.

In some embodiments, when the reflection part includes a plurality of reflective conductive parts arranged at intervals, the second planarization layer further includes a plurality of first via holes arranged at intervals; wherein one first sub-electrode corresponds to at least one of the first via holes;
in the same sub-pixel, the first sub-electrode is electrically connected to the corresponding reflective conductive part through the first via hole.

In some embodiments, the orthographic projection of the pixel defining layer on the base substrate covers orthographic projections of the first via holes on the base substrate.

In some embodiments, in the same sub-pixel, some of the plurality of first via holes are located on a first side of the first sub-electrodes, and remaining first via holes are located on a second side of the first sub-electrodes; wherein the first side is opposite to the second side.

In some embodiments, the first planarization layer further includes a plurality of second via holes arranged at intervals; wherein one reflective conductive part corresponds to at least one of the second via holes;
in the same sub-pixel, the reflective conductive part is electrically connected to a drain in the source-drain layer through the corresponding second via hole.

In some embodiments, when the orthographic projections of the reflection parts on the base substrate cover the orthographic projections of the openings on the base substrate, the first sub-electrodes are electrically connected to a drain in the source-drain layer through conductive via holes;
the conductive via holes penetrate through the second planarization layer, the reflection layer and the first planarization layer, and the first sub-electrodes are insulated from the reflection layer.

In some embodiments, the conductive via holes include:
third via holes penetrating through the reflection parts, fourth via holes penetrating through the second planarization layer, and fifth via holes penetrating through the first planarization layer;
in the same conductive via hole, an orthographic projection of the fourth via hole on the base substrate and an orthographic projection of the fifth via hole on the base substrate are located in an orthographic projection of the third via hole on the base substrate, and the orthographic projection of the fourth via hole on the base substrate overlaps with the orthographic projection of the fifth via hole on the base substrate, and an insulating material is filled between the fourth via hole and the third via hole.

In some embodiments, the orthographic projection of the pixel defining layer on the base substrate covers orthographic projections of the fourth via holes on the base substrate.

In some embodiments, in the same sub-pixel, some of the plurality of fourth via holes are located on a first side of the first sub-electrode, and remaining fourth via holes are located on a second side of the first sub-electrodes; wherein the first side is opposite to the second side.

In some embodiments, materials of the reflection layer include a metal material and an ink material.

In some embodiments, the array substrate further includes: a light-emitting functional layer located on a side of the first transparent electrode layer away from the base substrate, a second transparent electrode layer located on a side of the light-emitting functional layer away from the base substrate, a thin-film encapsulation layer located on a side of the second transparent electrode layer away from the base substrate, and a circular polarizer located on a side of the thin-film encapsulation layer away from the base substrate.

Embodiments of the disclosure further provide a display device, including: the above-mentioned array substrate, and a prism layer located on a side of the circular polarizer away from the base substrate.

DETAILED DESCRIPTION OF THE EMBODIMENTS

In order to make the purposes, technical solutions and advantages of the disclosure clearer, the technical solutions of the embodiments of the disclosure will be described clearly and completely below in combination with the accompanying drawings of the embodiments of the disclosure. Obviously the described embodiments are a part of the embodiments of the disclosure but not all the embodiments. Also in the case of no conflict, the embodiments and the features therein in the disclosure can be combined with each other. Based upon the embodiments of the disclosure, all of other embodiments obtained by those ordinary skilled in the art without creative work pertain to the protection scope of the disclosure.

Unless otherwise defined, the technical or scientific terms used in the disclosure shall have the general meaning understood by those ordinary skilled in the art to which the disclosure belongs. The "first", "second" and similar words used in the disclosure do not represent any order, number or importance, and are only used to distinguish different components. The word such as "include" or "contain" or the like means that the element or object appearing before this word encompasses the elements or objects and their equivalents listed after this word, without excluding other elements or objects. The word such as "connect" or "connected" or the like is not limited to the physical or mechanical connection, but can include the electrical connection, whether direct or indirect.

It is necessary to note that the size and shape of each diagram in the accompanying drawings do not reflect the true proportion, and are merely for purpose of schematically illustrating the content of the disclosure. Also, the same or similar reference numbers represent the same or similar elements or the elements having the same or similar functions all the way.

Generally, a display panel has a plurality of sub-pixels spx, and electroluminescent diodes are arranged in the sub-pixels spx, thereby realizing the display function. The general electroluminescent diode may include an anode, a light-emitting functional layer and a cathode that are stacked. As the requirement for the resolution of the display panel is getting higher and higher, the anode in one sub-pixel spx can be divided into a plurality of sub-anodes, so that one original electroluminescent diode can be changed into a plurality of electroluminescent diodes in one sub-pixel spx, thereby achieving the effect of improving the resolution.

Figure 1:
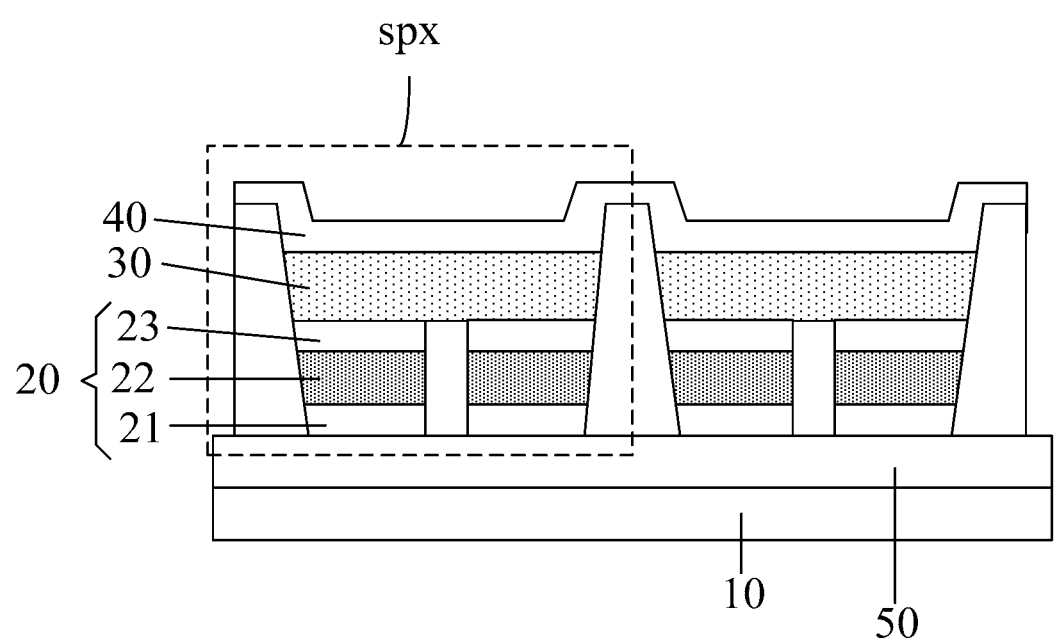
FIG. 1 is a schematic structural diagram of an array substrate in the related art.

For example, as shown in FIG. 1, the display panel may include: a substrate 10, a transistor array layer (not shown in the figure) located on the substrate 10, a planarization layer 50 located on the side of the transistor array layer away from the substrate 10, a sub-anode 20 located on the side of the planarization layer 50 away from the substrate 10, a light-emitting functional layer 30 located on the side of the sub-anode 20 away from the substrate 10, and a cathode 40 located on the side of the light-emitting functional layer 30 away from the substrate 10. FIG. 1 shows that the anode in one sub-pixel spx is divided into two sub-anodes 20, so that one original electroluminescent diode can be changed into two electroluminescent diodes in one sub-pixel spx, thereby achieving the effect of improving the resolution. When the display panel is applied for 3D display, the resolution of the 3D display can be increased.

Exemplarily, the sub-anode 20 may be formed by a layered structure. For example, the sub-anode 20 includes a first ITO (Indium Tin Oxide) layer 21, a silver layer 22 and a second ITO layer 23 that are stacked, so that both the conductive function and the reflection effect can be realized. Usually, in the actual preparation, the thickness of the first ITO layer 21 is generally 5 to 10 nm, the thickness of the silver layer 22 is generally 90 to 110 nm, and the thickness of the second ITO layer 23 is generally 5 to 10 nm. In this way, the sub-anode in the sub-pixel spx can be prepared and formed.

Embodiments of the disclosure provide an array substrate, which can improve the unevenness of the light-emitting functional layer due to the step difference, and improve the display effect.

The array substrate provided by the embodiments of the disclosure, as shown in FIG. 2 to FIG. 5, may include:
- a base substrate 100 including a plurality of sub-pixels spx; wherein at least one (e.g., each) of the plurality of sub-pixels includes:
- an active layer 162, located on a side of the base substrate 100;
- a gate insulating layer 163, located on a side of the active layer 162 away from the base substrate 100;
- a gate 164, located on a side of the gate insulating layer 163 away from the base substrate 100;
- an interlayer insulating layer 167, located on a side of the gate 164 away from the base substrate 100;
- a source-drain layer 168, located on a side of the interlayer insulating layer 167 away from the base substrate 100;
- a first planarization layer 150, located on a side of the source-drain layer 168 away from the base substrate 100;
- an anode 200, located on a side of the first planarization layer 150 away from the base substrate 100; wherein the anode 200 includes:
- a reflection layer 110, located on the side of the first planarization layer away 150 from the base substrate 100 and including a plurality of reflection parts 111 arranged at intervals;
- a second planarization layer 120, located on a side of the reflection layer 110 away from the base substrate 100 and covering the reflection layer 110 and the base substrate 100;
- a first transparent electrode layer 130, located on a side of the second planarization layer 120 away from the base substrate 100 and including a plurality of first electrodes 131 arranged at intervals; wherein there is at least an overlapping area between orthographic projections of the first electrodes 131 on the base substrate 100 and orthographic projections of the reflection parts 111 on the base substrate 100 in the same sub-pixel spx.

In the above-mentioned array substrate provided by the embodiments of the disclosure, the anode include the reflection layer, the second planarization layer and the first transparent electrode layer. The second planarization layer may be disposed between the reflection layer and the first transparent electrode layer, so as to separate the reflection layer from the first transparent electrode layer. In this way, not only the function of reflecting light can be realized through the reflection layer, but also the step difference between the first electrode and the second planarization layer is only the film thickness of the first electrode, so that it is beneficial to improve the flatness of other film layers (for example, light-emitting functional layer, cathode layer) when these film layers are formed on the first electrode, thereby improving the display uniformity.

Figure 2:
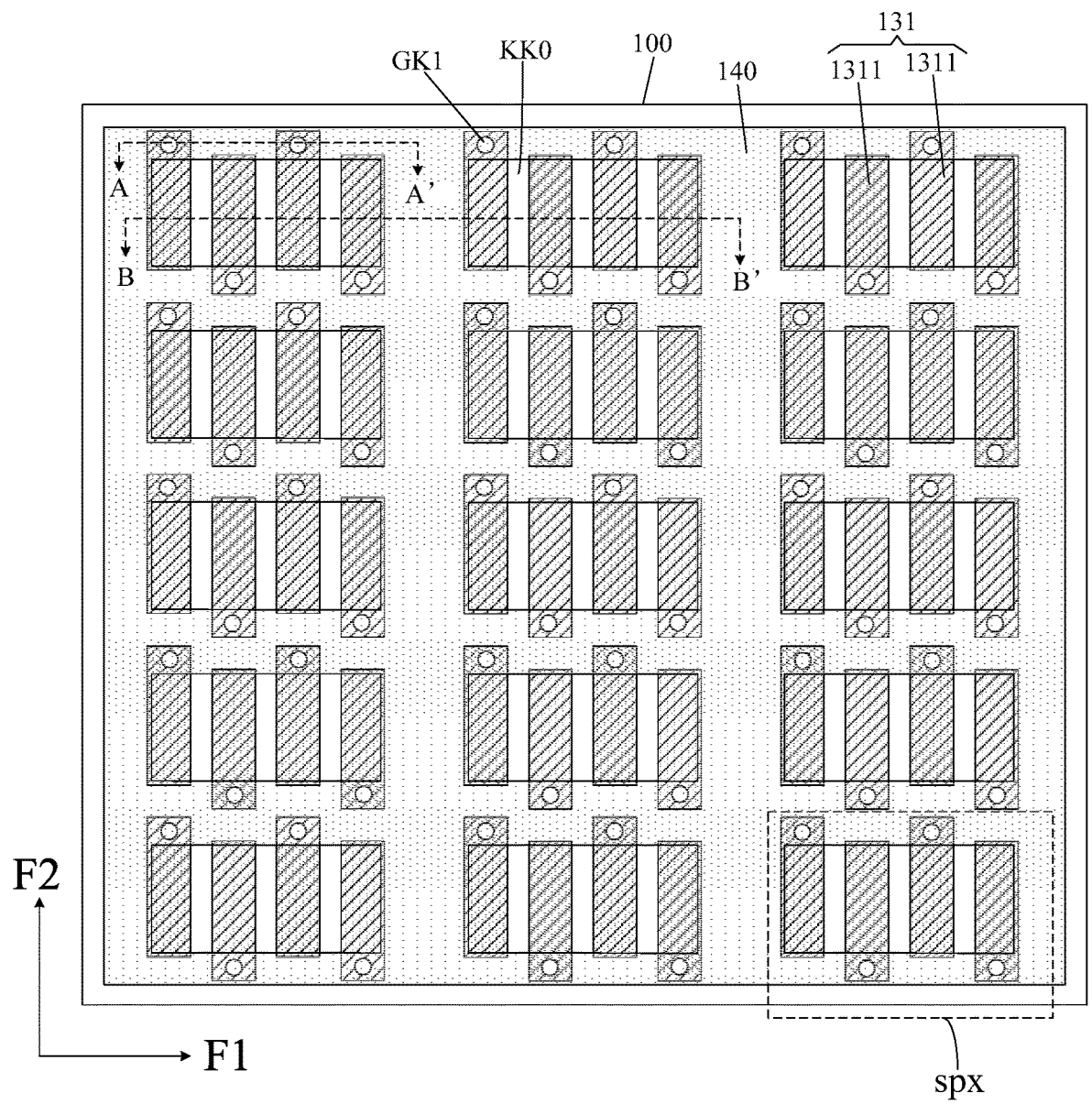
FIG. 2 is a schematic diagram of a top-view structure of an array substrate in an embodiment of the disclosure.
Figure 3A:
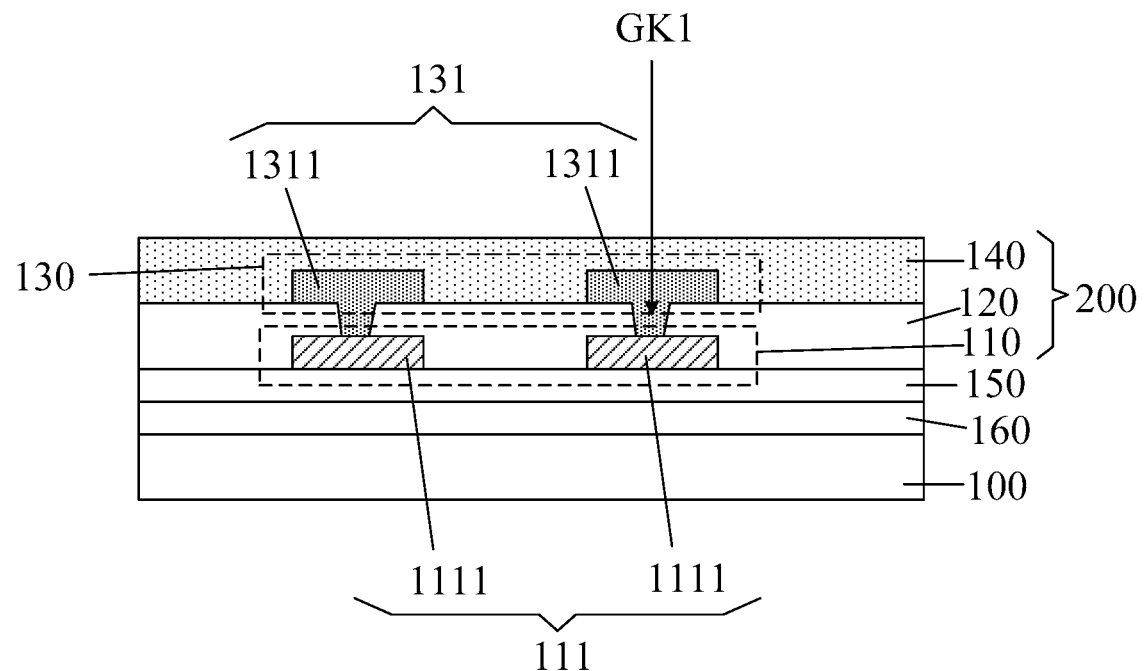
FIG. 3A is a schematic diagram of a cross-sectional structure of the array substrate shown in FIG. 2 along the direction AA'.
Figure 3B:
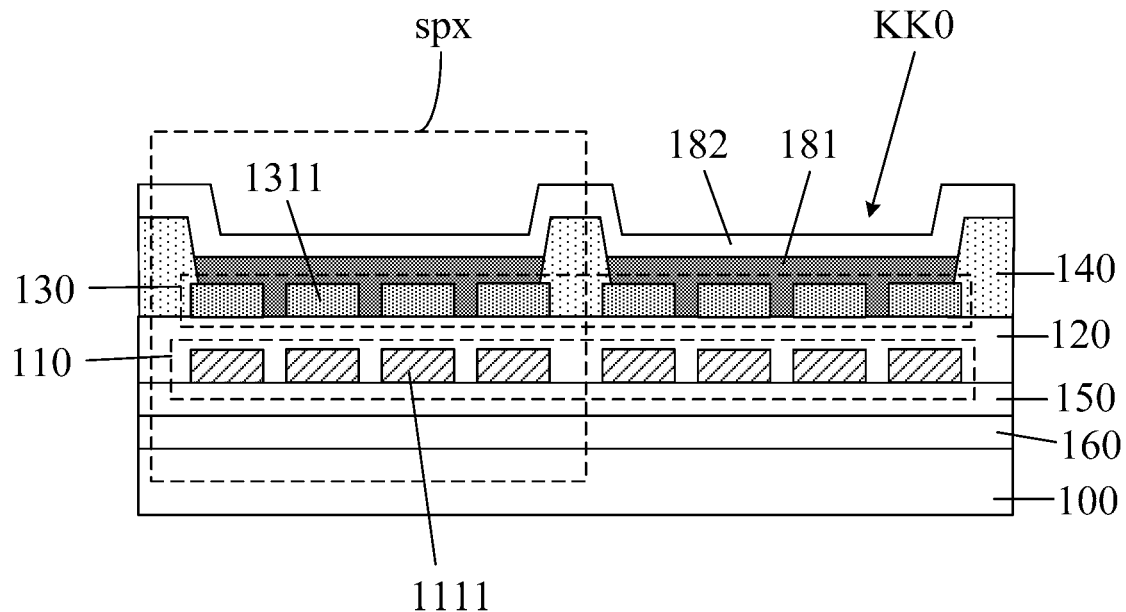
FIG. 3B is a schematic diagram of a cross-sectional structure of the array substrate shown in FIG. 2 along the direction BB'.

In an implementation, in embodiments of the disclosure, as shown in FIG. 2 to FIG. 3B, the array substrate may further include: a pixel defining layer 140 located on a side of the first transparent electrode layer 130 away from the base substrate 100. An orthographic projection of the pixel defining layer 140 on the base substrate 100 covers at least a first gap between orthographic projections of reflection parts 111 in two adjacent rows of sub-pixels on the base substrate 100 and a second gap between orthographic projections of first electrodes 131 in two adjacent rows of sub-pixels on the base substrate 100. In this way, two adjacent rows of sub-pixels can be separated by the pixel defining layer 140.

Exemplarily, as shown in FIG. 2, the pixel defining layer 140 includes a plurality of openings KK0 arranged at intervals. The sub-pixel spx includes an opening KK0. In the same sub-pixel spx, there is at least an overlapping area between the orthographic projection of the opening KK0 on the base substrate 100 and the orthographic projection of the overlapping area of the first electrode 131 and the reflection part 111 on the base substrate 100. The orthographic projection of the pixel defining layer 140 on the base substrate 100 covers a first gap between orthographic projections of reflection parts 111 in two adjacent rows of sub-pixels on the base substrate 100 and a second gap between orthographic projections of first electrodes 131 in two adjacent rows of sub-pixels on the base substrate 100. Also, the orthographic projection of the pixel defining layer 140 on the base substrate 100 further covers a third gap between orthographic projections of reflection parts 111 in two adjacent columns of sub-pixels on the base substrate 100 and a fourth gap between orthographic projections of first electrodes 131 in two adjacent columns of sub-pixels on the base substrate 100. In this way, the light-emitting area of the sub-pixels spx is defined by the openings KK0 in the pixel defining layer 140.

Figure 6:
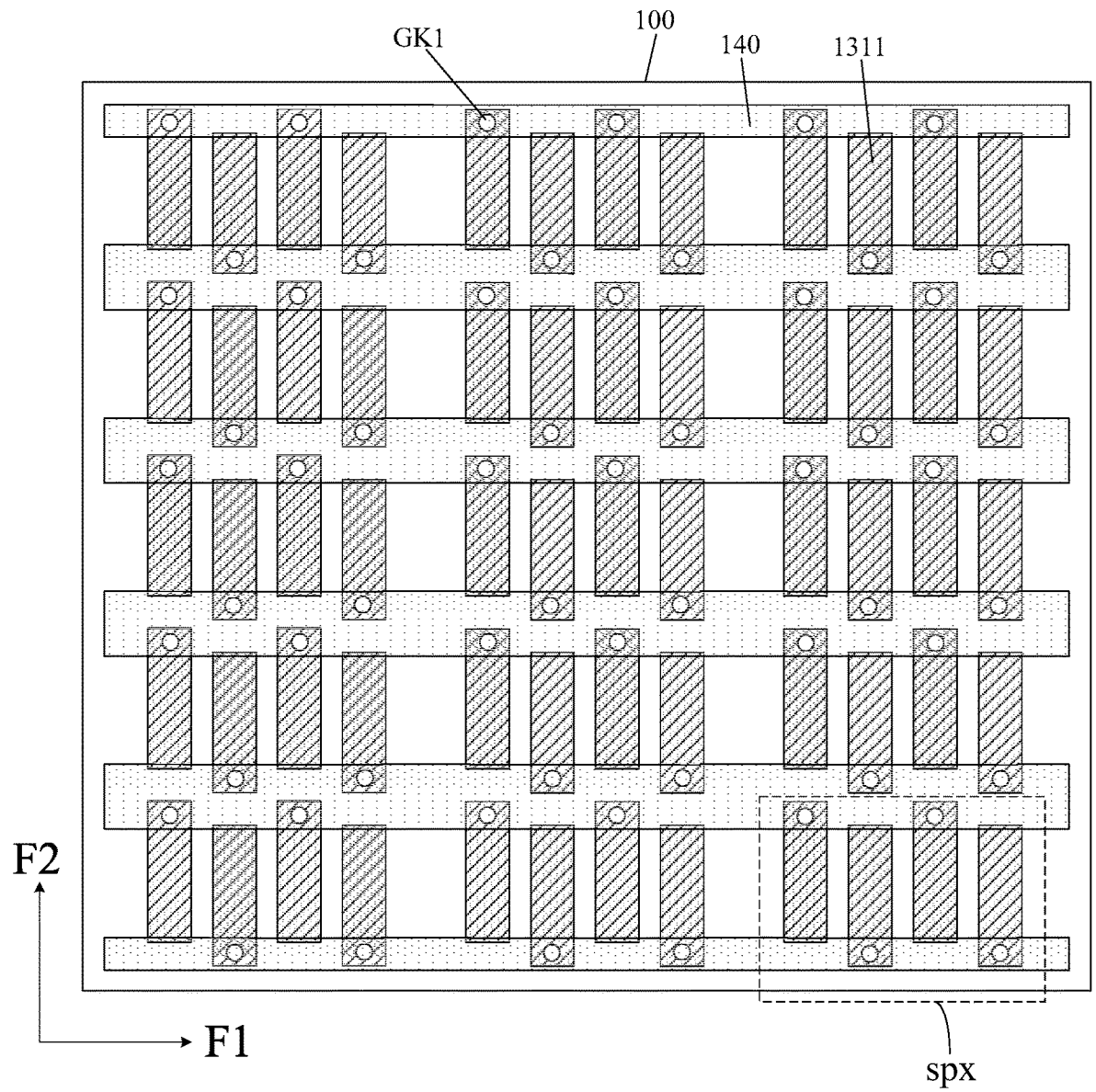
FIG. 6 is a schematic diagram of another top-view structure of an array substrate in an embodiment of the disclosure.

Exemplarily, as shown in FIG. 6, the shape of the pixel-defining layer 140 may be a strip shape, so that the orthographic projection of the pixel-defining layer 140 on the base substrate 100 can cover the first gap between orthographic projections of reflection parts 111 in two adjacent rows of sub-pixels on the base substrate 100 and the second gap between orthographic projections of first electrodes 131 in two adjacent rows of sub-pixels on the base substrate 100.

Exemplarily, the thickness of the first transparent electrode layer 130 in the direction perpendicular to the plane where the base substrate 100 is located may be set as 8 to 40 nm. For example, the thickness of the first transparent electrode layer 130 may be set as 10 to 30 nm. For example, the thickness of the first transparent electrode layer 130 may be set as 8 nm. The thickness of the first transparent electrode layer 130 may be set as 10 nm. The thickness of the first transparent electrode layer 130 may be set as 20 nm. The thickness of the first transparent electrode layer 130 may be set as 30 nm. The thickness of the first transparent electrode layer 130 may be set as 40 nm. In a practical application, the thickness of the first transparent electrode layer 130 may be designed and determined according to the actual application environment, which is not limited here.

Exemplarily, the material of the first transparent electrode layer 130 may include transparent conductive material, e.g., Indium Tin Oxide (ITO) material, Indium Zinc Oxide (IZO) material, carbon nanotube or graphene or the like, which is not limited here.

Exemplarily, the thickness of the second planarization layer 120 in the direction perpendicular to the plane where the base substrate 100 is located may be set as 80 to 100 nm. For example, the thickness of the second planarization layer 120 may be set as 85 to 95 nm. For example, the thickness of the second planarization layer 120 may be set as 80 nm. The thickness of the second planarization layer 120 may also be set as 85 nm. The thickness of the second planarization layer 120 may also be set as 90 nm. The thickness of the second planarization layer 120 may also be set as 95 nm. The thickness of the second planarization layer 120 may also be set as 100 nm. In a practical application, the thickness of the second planarization layer 120 may be designed and determined according to the actual application environment, which is not limited here.

Exemplarily, the material of the second planarization layer 120 may include insulating material, such as silicon nitride or silicon dioxide, which is not limited here.

Exemplarily, the thickness of the reflection layer in the direction perpendicular to the plane where the base substrate 100 is located may be set as 60 to 80 nm. For example, the thickness of the reflection layer may be set as 65 to 75 nm. For example, the thickness of the reflection layer may be set as 60 nm. The thickness of the reflection layer may also be set as 65 nm. The thickness of the reflection layer may also be set as 70 nm. The thickness of the reflection layer may also be set as 75 nm. The thickness of the reflection layer may also be set as 80 nm. In a practical application, the thickness of the reflection layer may be designed and determined according to the actual application environment, which is not limited here.

Exemplarily, the thickness of the pixel defining layer in the direction perpendicular to the plane where the base substrate 100 is located may be set as 1.5 to 2.0 μm. For example, the thickness of the pixel defining layer may be set as 1.6 to 1.9 μm. For example, the thickness of the pixel defining layer may be set as 1.5 μm. The thickness of the pixel defining layer may also be set as 1.6 μm. The thickness of the pixel defining layer may also be set as 1.75 μm. The thickness of the pixel defining layer may also be set as 1.9 μm. The thickness of the pixel defining layer may also be set as 2.0 μm. In a practical application, the thickness of the pixel defining layer may be designed and determined according to the actual application environment, which is not limited here.

During implementations, in embodiments of the disclosure, as shown in FIG. 2 to FIG. 3B, the first electrode 131 includes a plurality of first sub-electrodes 1311 arranged at intervals. The orthographic projections of the first sub-electrodes 1311 on the base substrate 100 overlap respectively with the orthographic projections of the reflection parts 111 on the base substrate 100 in the same sub-pixel spx. Further, the openings KK0 expose portions in the first sub-electrodes 1311 that overlap with the reflection parts 111. In this way, the first electrode 131 in one sub-pixel spx can be divided into a plurality of first sub-electrodes 1311, thereby improving the resolution. Moreover, since the thickness of the first sub-electrode 1311 is between 8 and 40 nm, the step difference between the first sub-electrode 1311 and the second planarization layer 120 may be between 8 and 40 nm. Compared with the step difference of nearly 120 nm, the step difference between the first sub-electrode 1311 and the second planarization layer 120 can be significantly reduced.

Exemplarily, as shown in FIG. 2, a plurality of first sub-electrodes 1311 in the same sub-pixel spx may be strip electrodes extending along the first direction F1 and arranged along the second direction. Alternatively, a plurality of first sub-electrodes 1311 in the same sub-pixel spx may also be block electrodes arranged in an array along the first direction F1 and the second direction F2. In a practical application, the shape of the first sub-electrode 1311 may be designed and determined according to the requirements of the actual application environment, which is not limited here.

Exemplarily, the first direction F1 may be the row direction, and the second direction F2 may be the column direction. Alternatively, the first direction F1 may be the column direction, and the second direction F2 may be the row direction, which is not limited here.

Figure 4:
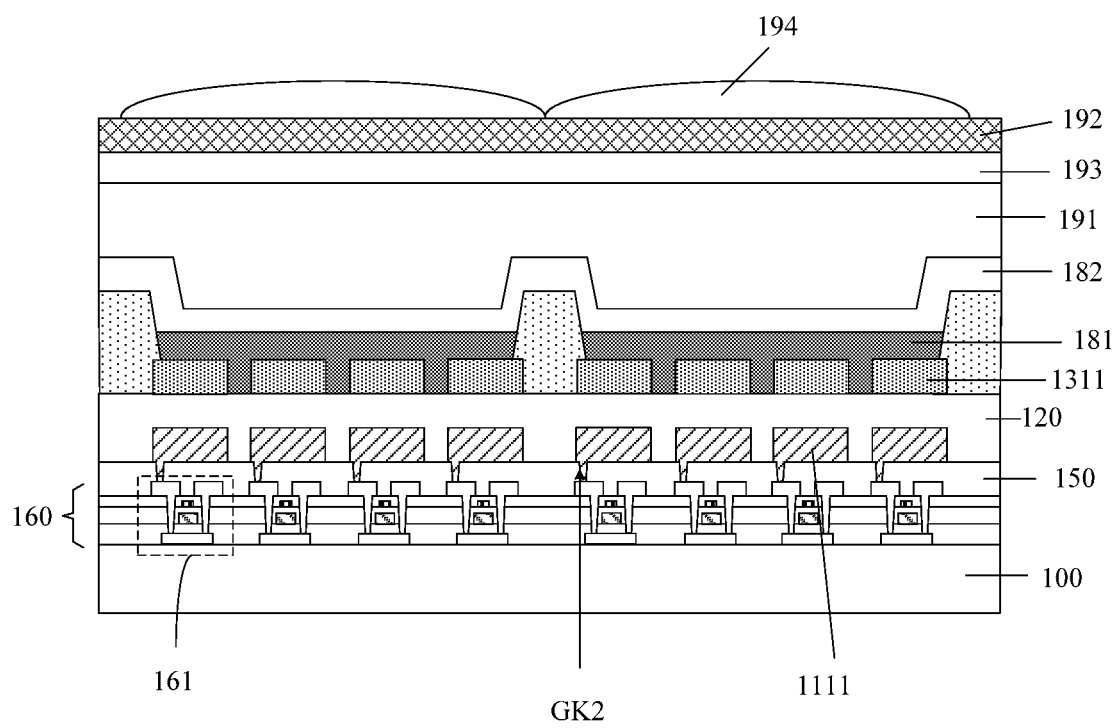
FIG. 4 is a schematic diagram of a partial cross-sectional structure of an array substrate in an embodiment of the disclosure.

During implementations, in embodiments of the disclosure, as shown in FIG. 4, the array substrate may further include: a light-emitting functional layer 181 (e.g., a hole injection layer, a hole transport layer, a light-emitting layer, an electron transport layer) located on a side of the first transparent electrode layer 130 away from the base substrate 100, a second transparent electrode layer 182 located on a side of the light-emitting functional layer 181 away from the base substrate 100, a thin-film encapsulation layer 191 located on a side of the second transparent electrode layer 182 away from the base substrate 100, and a circular polarizer 192 located on a side of the thin-film encapsulation layer 191 away from the base substrate 100. Here, the circular polarizer 192 is attached onto the thin-film encapsulation layer 191 through an adhesive layer 193. The thin-film encapsulation layer 191 may include a first inorganic layer, an organic layer and a second inorganic layer that are stacked. It should be noted that the structure of the thin-film encapsulation layer 191 may be basically the same as that in the related art, which will not be repeated here.

Exemplarily, the material of the second transparent electrode layer may include transparent conductive material, e.g., Indium Tin Oxide (ITO) material, Indium Zinc Oxide (IZO) material, carbon nanotube or graphene or the like, which is not limited here.

During implementations, in embodiments of the disclosure, the array substrate may include: a plurality of pixel units arranged in an array in the display area of the base substrate 100. Each pixel unit includes a plurality of sub-pixels spx. Exemplarily, the pixel unit may include a red sub-pixel, a green sub-pixel and a blue sub-pixel, so that the red, green and blue colors can be mixed to realize the color display. Alternatively, the pixel unit may also include a red sub-pixel, a green sub-pixel, a blue sub-pixel and a white sub-pixel, so that the red, green, blue and white colors can be mixed to realize the color display. Of course, in a practical application, the light-emitting colors of the sub-pixels spx in the pixel unit may be designed and determined according to the actual application environment, which is not limited here.

During implementations, in embodiments of the disclosure, the sub-pixel spx may include an electroluminescent diode and a driving circuit for driving the electroluminescent diode to emit light. The stacked first sub-electrode 1311, light-emitting functional layer 181 and second transparent electrode layer 182 may form an electroluminescent diode. Therefore, the sub-pixel spx in the embodiment of the disclosure may include a plurality of electroluminescent diodes, for example, the sub-pixel spx may include 2, 3, 4 or more electroluminescent diodes. In order to realize independent control, one electroluminescent diode may be electrically connected to one driving circuit correspondingly. The general driving circuit may include a plurality of thin film transistors, such as driving transistors, switching transistors and the like, and a storage capacitor. The specific structure and working principle thereof may be the same as those in the related art, which will not be repeated here.

As shown in FIG. 4, the stacked first electrode 131, light-emitting functional layer 181 and second transparent conductive layer may form an electroluminescent diode, for example, an Organic Light Emitting Diode (OLED), a Quantum Dot Light Emitting Diode (QLED), etc. Therefore, one sub-pixel spx in the embodiments of the disclosure may include a plurality of electroluminescent diodes, thereby improving the resolution.

Figure 5:
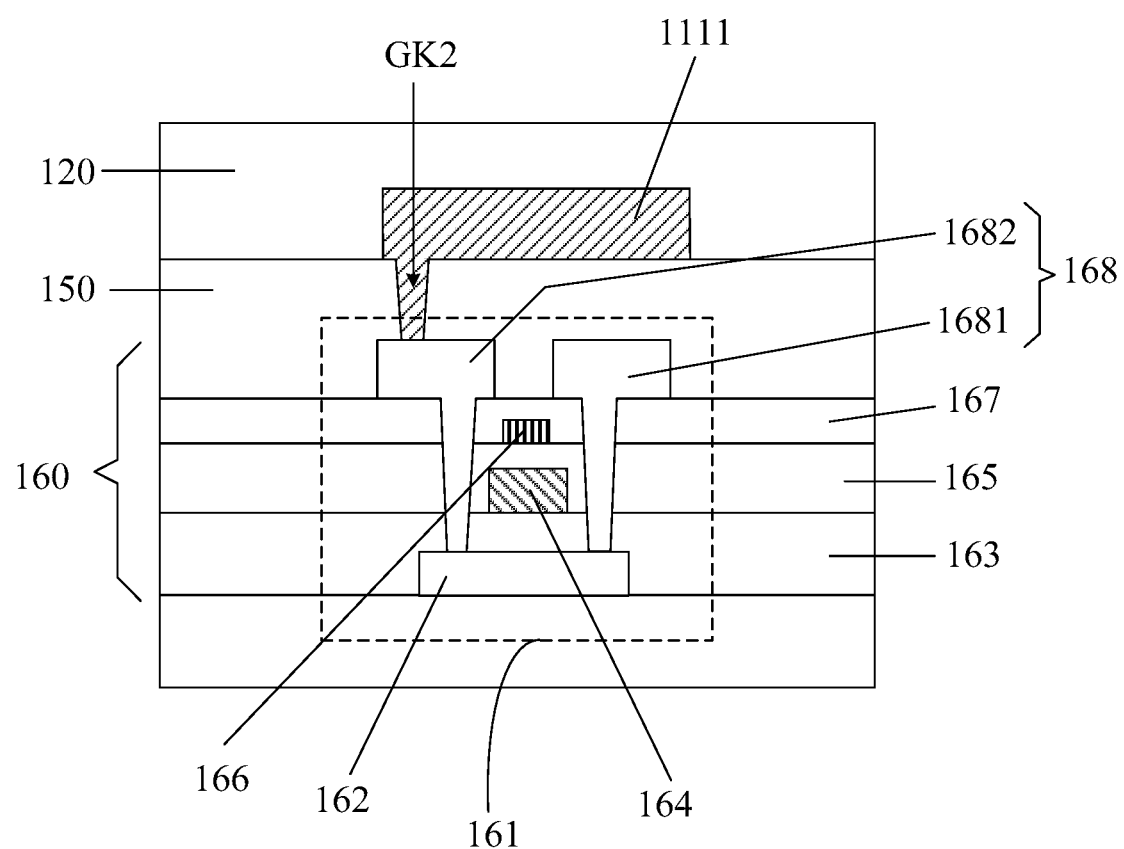
FIG. 5 is a schematic diagram of a partially-enlarged cross-sectional structure of an array substrate in an embodiment of the disclosure.

As shown in FIG. 4 and FIG. 5, a thin film transistor 161 in the driving circuit is taken as an example. In order to independently control each electroluminescent diode in each sub-pixel spx, one driving circuit may drive one electroluminescent diode correspondingly, that is, one thin film transistor may be electrically connected to one electroluminescent diode. Exemplarily, the transistor array layer 160 includes a plurality of thin film transistors arranged at intervals, so that the thin film transistors and the storage capacitor in the driving circuit can be formed in the transistor array layer.

Exemplarily, as shown in FIG. 5, the thin film transistor 161 may include: an active layer 162 on one side of the base substrate 100, a gate insulating layer 163 on the side of the active layer 162 away from the base substrate 100, a gate 164 on the side of the gate insulating layer 163 away from the base substrate 100, an interlayer dielectric layer 165 on the side of the gate insulating layer 163 away from the base substrate 100, a capacitor electrode layer 166 on the side of the interlayer dielectric layer 165 away from the base substrate 100, an interlayer insulating layer 167 on the side of the capacitor electrode layer 166 away from the base substrate 100, and a source-drain layer 168 on the side of the interlayer insulating layer 167 away from the base substrate 100. A source 1681 in the source-drain layer 168 is electrically connected to other corresponding thin film transistor, a drain 1682 is electrically connected to a corresponding reflective conductive part 1111 through a second via hole GK2, and the source 1681 and the drain 1682 are further electrically connected to the active layer 162 respectively through via holes penetrating the gate insulating layer 163, the interlayer dielectric layer 165 and the interlayer insulating layer 167. Further, there is an overlapping area between the orthographic projection of the capacitor electrode layer 166 on the base substrate 100 and the orthographic projection of the gate 164 on the base substrate 100, so that the capacitor electrode layer 166 and the gate 164 can form a storage capacitor.

Exemplarily, the thin film transistor 161 may also include: an active layer 162 on one side of the base substrate 100, a gate insulating layer 163 on the side of the active layer 162 away from the base substrate 100, and a gate 164 on the side of the gate insulating layer 163 away from the base substrate 100, an interlayer insulating layer 167 on the side of the gate 164 away from the base substrate 100, and a source-drain layer 168 on the side of the interlayer insulating layer 167 away from the base substrate 100. A source 1681 in the source-drain layer 168 is electrically connected to other corresponding thin film transistor, a drain 1682 is electrically connected to a corresponding reflective conductive part 1111 through a second via hole GK2, and the source 1681 and the drain 1682 are further electrically connected to the active layer 162 respectively through via holes penetrating the gate insulating layer 163 and the interlayer insulating layer 167.

It should be noted that the transistor array layer 160 formed of the active layer 162, the gate insulating layer 163, the gate 164, the interlayer dielectric layer 165, the capacitor electrode layer 166, the interlayer insulating layer 167 and the source-drain layer 168 is schematically illustrated in FIGS. 3A to 4.

During implementations, in embodiments of the disclosure, as shown in FIG. 2 to FIG. 3B, the reflection part 111 may include a plurality of reflective conductive parts arranged at intervals. The orthographic projection of one first sub-electrode 1311 on the base substrate 100 overlaps with the orthographic projection of one reflective conductive part on the base substrate 100. Exemplarily, the orthographic projection of one first sub-electrode 1311 on the base substrate 100 is coincided with the orthographic projection of one reflective conductive part on the base substrate 100, so that one first sub-electrode 1311 can correspond to one reflective conductive part.

Exemplarily, the material of the reflective conductive part may include metal material, such as gold, silver, copper, aluminum, molybdenum, etc., which is not limited here.

During implementations, in embodiments of the disclosure, as shown in FIG. 2 to FIG. 3B, the second planarization layer 120 further includes a plurality of first via holes GK1 arranged at intervals. One first sub-electrode 1311 corresponds to at least one first via hole GK1. Further, in the same sub-pixel spx, the first sub-electrode 1311 is electrically connected to the corresponding reflective conductive part through the first via hole GK1. Exemplarily, one first sub-electrode 1311 may correspond to one, two, three or more first via holes GK1, which is not limited here.

In order to prevent the first via holes GK1 from affecting the flatness of the light-emitting functional layer 181 in the light-emitting area, during implementations, in embodiments of the disclosure, as shown in FIG. 2 to FIG. 3B, the orthographic projection of the pixel defining layer 140 on the base substrate 100 covers the orthographic projections of the first via holes GK1 on the base substrate 100. In this way, the first via holes GK1 are arranged in the area where the pixel defining layer 140 exists, to avoid the arrangement of the first via holes GK1 in the light-emitting area, thereby reducing the influence of the first via holes GK1 on the flatness of the first sub-electrodes 1311, and thus avoiding the influence on the flatness of the light-emitting functional layer 181 in the light-emitting area.

During implementations, in embodiments of the disclosure, as shown in FIG. 4, a first planarization layer 150 is disposed between the transistor array layer 160 and the reflection layer. The first planarization layer 150 may further include a plurality of second via holes GK2 arranged at intervals; and one reflective conductive part corresponds to one thin film transistor and at least one second via hole GK2. Also, in the same sub-pixel spx, the reflective conductive part is electrically connected to the corresponding thin film transistor through the corresponding second via hole GK2, so that the driving circuit can be electrically connected to the first sub-electrode 1311 through the reflective conductive part, to input the driving signal to the first sub-electrode 1311. Exemplarily, one reflective conductive part may correspond to one, two, three or more second via holes GK2, which is not limited here.

During implementations, in embodiments of the disclosure, the orthographic projections of the first via hole GK1 and the second via hole GK2 corresponding to the same reflective conductive part on the base substrate 100 may not overlap, so that the stability of the electrical connection of the thin film transistor and the first sub-electrode 1311 can be improved.

During implementations, in embodiments of the disclosure, as shown in FIG. 2 to FIG. 3B, in the same sub-pixel spx, some of the plurality of first via holes GK1 are located on the first side of the first sub-electrode 1311, and the remaining first via holes GK1 are located on the second side of the first sub-electrode 1311. The first side and the second side are opposite to each other in the second direction F2. Exemplarily, in the same sub-pixel spx, in the first direction F1, the first via holes GK1 corresponding to the first sub-electrodes 1311 in the odd-numbered columns are located on the first side, and the first via holes GK1 corresponding to the first sub-electrodes 1311 in the even-numbered columns are located on the second side, so that the height difference between the upper surface of the pixel defining layer covering the first via holes GK1 and the upper surface of the second planarization layer can be relatively uniform, improving the uniformity of the film thickness of the pixel defining layer.

Alternatively, a plurality of first via holes GK1 in the same sub-pixel spx may all be located on the first side or the second side, which is not limited here.

Figure 7:
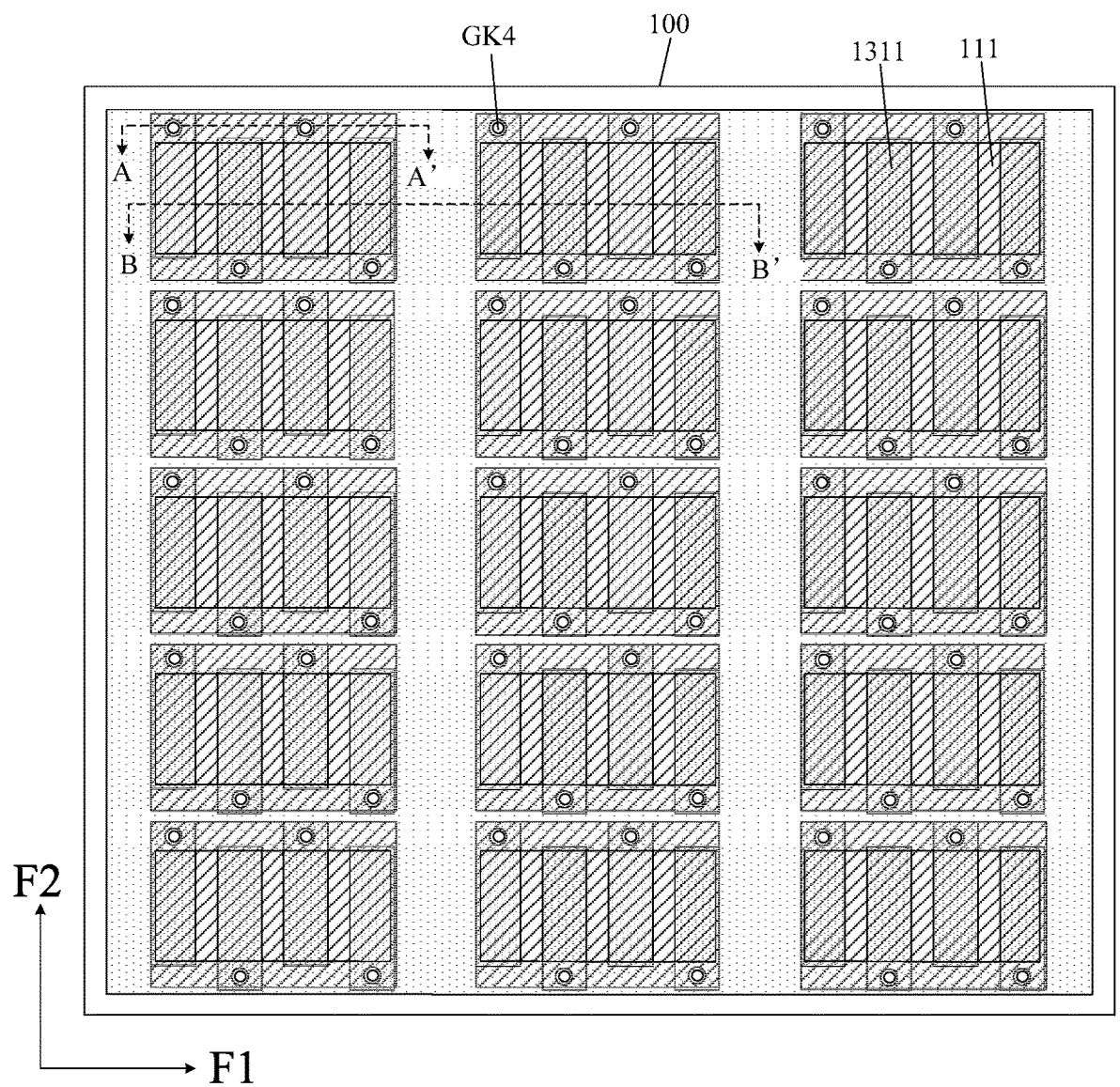
FIG. 7 is a schematic diagram of a structure of an array substrate in an embodiment of the disclosure.

Embodiments of the disclosure further provide some display panels, and the structural schematic diagram thereof is as shown in FIG. 7, which is a variant from the implementations in the above-mentioned embodiments. Only the differences between this embodiment and the above embodiments are illustrated below, and the similarities thereof are not repeated here.

Figure 8A:
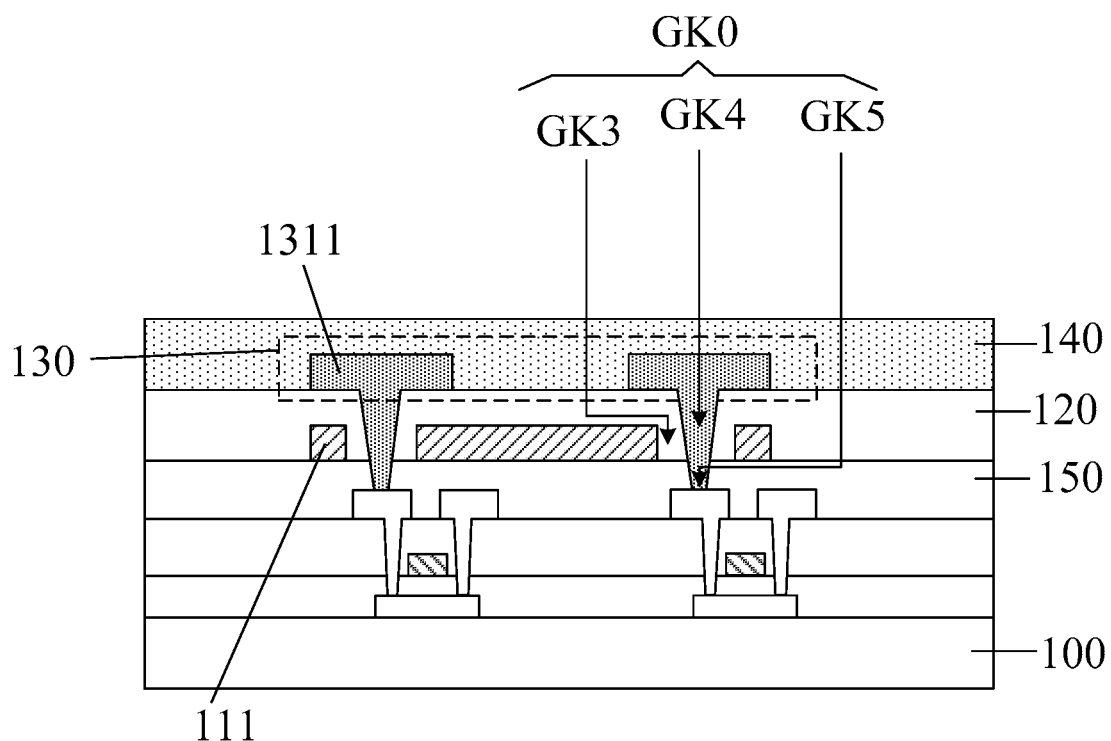
FIG. 8A is a schematic diagram of a cross-sectional structure of the array substrate shown in FIG. 7 along the direction AA'.
Figure 8B:
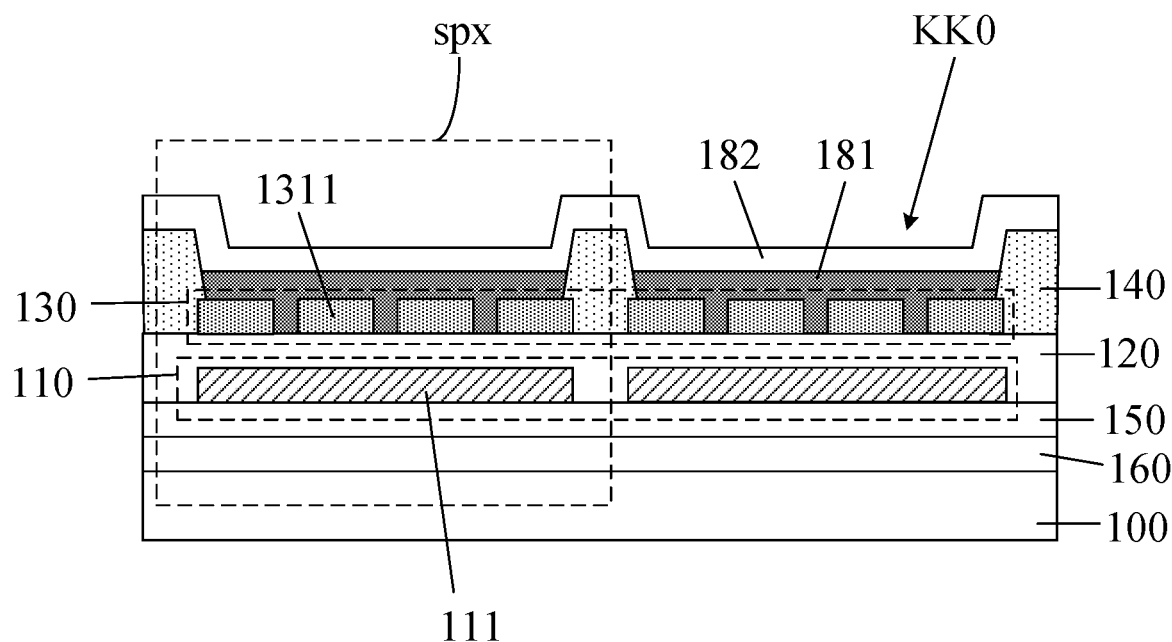
FIG. 8B is a schematic diagram of a cross-sectional structure of the array substrate shown in FIG. 7 along the direction BB'.

During implementations, in embodiments of the disclosure, as shown in FIG. 7 to FIG. 8B, the orthographic projections of the reflection parts 111 on the base substrate 100 may cover the orthographic projections of the openings KK0 on the base substrate 100, so that the reflection parts 111 can be arranged in a block-like structure.

In order to electrically connect the first sub-electrodes 1311 to the thin film transistors, the conductive via holes GK0 penetrating through the second planarization layer 120, the reflection layer 110 and the first planarization layer may be arranged, so that the first sub-electrodes 1311 are electrically connected to the drain 1682 in the corresponding source-drain electrode layer 168 through the conductive via holes GK0, and the first sub-electrodes 1311 are insulated from the reflection layer 110.

Exemplarily, the material of the reflection layer 110 may include metal material, such as gold, silver, copper, aluminum, molybdenum, etc. Alternatively, the material of the reflection layer 110 may include an ink material with reflectivity, which is not limited here.

Exemplarily, since the ink material is a non-conductive material, the second planarization layer 120, the reflection layer 110 and the first planarization layer may be directly etched and punched when the material of the reflection layer 110 is the ink material, to reduce the preparation difficulty of the process.

Exemplarily, since the metal material is a conductive material, when the material of the reflection layer 110 is the metal material, in order to prevent the first sub-electrodes 1311 from being electrically connected through the block-shaped reflection parts 111, during implementations, in embodiments of the disclosure, as shown in FIG. 7 to FIG. 8B, the conductive via holes GK0 may include: third via holes GK3 penetrating through the reflection parts 111, fourth via holes GK4 penetrating through the second planarization layer 120, and fifth via holes GK5 penetrating through the first planarization layer. In the same conductive via hole GK0, an orthographic projection of the fourth via hole GK4 on the base substrate 100 and an orthographic projection of the fifth via hole GK5 on the base substrate 100 are located in an orthographic projection of the third via hole GK3 on the base substrate 100, and the orthographic projection of the fourth via hole GK4 on the base substrate 100 overlaps with the orthographic projection of the fifth via hole GK5 on the base substrate 100, and an insulating material is filled between the fourth via hole GK4 and the third via hole GK3. Exemplarily, the insulating material filled between the fourth via hole GK4 and the third via hole GK3 may be the same as the material of the second planarization layer 120. Thus, when the second planarization layer 120 is formed, the third via hole GK3 may filled with the material of the second planarization layer 120, and then the fourth via hole GK4 is formed, so as to insulate the first sub-electrode 1311 from the reflection structure and electrically connect the first sub-electrode 1311 to the thin film transistor.

During implementations, in embodiments of the disclosure, as shown in FIG. 7 to FIG. 8B, the orthographic projection of the pixel defining layer 140 on the base substrate 100 covers the orthographic projections of the fourth via holes GK4 on the base substrate 100. In this way, the fourth via holes GK4 are arranged in the area where the pixel defining layer 140 exists, to avoid the arrangement of the fourth via holes GK4 in the light-emitting area, thereby reducing the influence of the fourth via holes GK4 on the flatness of the first sub-electrodes 1311, and thus avoiding the influence on the flatness of the light-emitting functional layer 181 in the light-emitting area.

During implementations, in embodiments of the disclosure, as shown in FIG. 7 to FIG. 8B, in the same sub-pixel spx, some of the plurality of fourth via holes GK4 are located on the first side of the first sub-electrode 1311, and the remaining fourth via holes GK4 are located on the second side of the first sub-electrode 1311. The first side and the second side are opposite to each other. Exemplarily, in the same sub-pixel spx, in the first direction F1, the fourth via holes GK4 corresponding to the first sub-electrodes 1311 in the odd-numbered columns are located on the first side, and the fourth via holes GK4 corresponding to the first sub-electrodes 1311 in the even-numbered columns are located on the second side.

Alternatively, a plurality of fourth via holes GK4 in the same sub-pixel spx may all be located on the first side or the second side, which is not limited here.

Based on the same inventive concept, embodiments of the disclosure further provide a display device, including the above-mentioned array substrate provided by the embodiments of the disclosure. The principle of the display device to solve the problem is similar to that of the above-mentioned array substrate, so the implementations of the display device can refer to the implementations of the above-mentioned array substrate, and the detailed description thereof will be omitted here.

In order to apply the array substrate in the embodiments of the disclosure to the 3D display device, during implementations, in embodiments of the disclosure, as shown in FIG. 4, the display device may further include: a prism layer 194 located on a side of the circular polarizer 192 away from the base substrate 100, so that the 3D display can be realized by the function of the prism layer 194.

During implementations, in embodiments of the disclosure, the display device may be a mobile phone, a tablet, a television, a display, a laptop, a digital photo frame, a navigator, or any other product or component with display functions. All of other indispensable components of the display device should be understood by those ordinary skilled in the art to be included, and will be omitted here and should not be considered as limitations on the disclosure.

In the array substrate and the display device provided by the embodiments of the disclosure, the anode include the reflection layer, the second planarization layer and the first transparent electrode layer, and the second planarization layer may be disposed between the reflection layer and the first transparent electrode layer, so as to separate the reflection layer from the first transparent electrode layer. In this way, not only the function of reflecting light can be realized through the reflection layer, but also the step difference between the first electrode and the second planarization layer is only the film thickness of the first electrode, so that it is beneficial to improve the flatness of other film layers (for example, light-emitting functional layer, cathode layer) when these film layers are formed on the first electrode, thereby improving the display uniformity.

Evidently those skilled in the art can make various modifications and variations to the disclosure without departing from the spirit and scope of the disclosure. Thus the disclosure is also intended to encompass these modifications and variations to the disclosure as long as these modifications and variations come into the scope of the claims of the disclosure and their equivalents.

What is claimed is:

1. An array substrate, comprising:
    a base substrate comprising:
        a plurality of sub-pixels;
        wherein at least one of the plurality of sub-pixels comprises:
            an active layer on a side of the base substrate;
            a gate insulating layer on a side of the active layer away from the base substrate;
            a gate on a side of the gate insulating layer away from the base substrate;
            an interlayer insulating layer on a side of the gate away from the base substrate;
            a source-drain layer on a side of the interlayer insulating layer away from the base substrate;
            a first planarization layer on a side of the source-drain layer away from the base substrate; and
            an anode on a side of the first planarization layer away from the base substrate;
        wherein the anode comprises:
            a reflection layer, located on the side of the first planarization layer away from the base substrate and comprising a plurality of reflection parts arranged at intervals; wherein the reflection part comprises a plurality of reflective conductive parts arranged at intervals;
            a second planarization layer, located on a side of the reflection layer away from the base substrate, covering the reflection layer and the base substrate, and comprising a plurality of first via holes arranged at intervals;
            a first transparent electrode layer, located on a side of the second planarization layer away from the base substrate and comprising a plurality of first electrodes arranged at intervals; wherein the first electrode comprises a plurality of first sub-electrodes arranged at intervals;
            wherein there is at least an overlapping area between orthographic projections of the first electrodes on the base substrate and orthographic projections of the reflection parts on the base substrate in a same sub-pixel; one first sub-electrode corresponds to at least one of the first via holes; in the same sub-pixel, the first sub-electrode is electrically connected to a corresponding reflective conductive part through the first via hole; in the same sub-pixel, some of the plurality of first via holes are located on a first side of the first sub-electrodes, and remaining first via holes are located on a second side of the first sub-electrodes; wherein the first side is opposite to the second side.

2. The array substrate of claim 1, wherein the first planarization layer further comprises:
    a plurality of second via holes arranged at intervals;
    wherein one reflective conductive part corresponds to at least one of the second via holes;
    in the same sub-pixel, the reflective conductive part is electrically connected to a drain in the source-drain layer through a corresponding second via hole.

3. The array substrate of claim 1, wherein the array substrate further comprises:
    a light-emitting functional layer on a side of the first transparent electrode layer away from the base substrate;
    a second transparent electrode layer on a side of the light-emitting functional layer away from the base substrate;
    a thin-film encapsulation layer on a side of the second transparent electrode layer away from the base substrate; and
    a circular polarizer on a side of the thin-film encapsulation layer away from the base substrate.

4. A display device, comprising: the array substrate of claim 1, and a prism layer on a side of a circular polarizer away from the base substrate.

5. The array substrate of claim 1, wherein a thickness of the first transparent electrode layer in a direction perpendicular to a plane where the base substrate is located is 8 nm to 40 nm.

6. The array substrate of claim 1, wherein the array substrate further comprises:
    a pixel defining layer, located on a side of the first transparent electrode layer away from the base substrate and comprising a plurality of openings;
    wherein an orthographic projection of the pixel defining layer on the base substrate covers at least:
        a first gap between orthographic projections of reflection parts in two adjacent rows of sub-pixels on the base substrate, and
        a second gap between orthographic projections of first electrodes in two adjacent rows of sub-pixels on the base substrate.

7. The array substrate of claim 6,
    wherein orthographic projections of the first sub-electrodes on the base substrate overlap respectively with the orthographic projections of the reflection parts on the base substrate in the same sub-pixel; and
    the openings expose portions in the first sub-electrodes that overlap with the reflection parts.

8. The array substrate of claim 7,
    wherein an orthographic projection of one of the first sub-electrodes on the base substrate overlaps with an orthographic projection of one of the reflective conductive parts on the base substrate.

9. The array substrate of claim 6, wherein the orthographic projection of the pixel defining layer on the base substrate covers orthographic projections of the first via holes on the base substrate.

10. The array substrate of claim 7, wherein the orthographic projections of the reflection parts on the base substrate cover orthographic projections of the openings on the base substrate in the same sub-pixel.

11. The array substrate of claim 10, wherein, the first sub-electrodes are electrically connected to a drain in the source-drain layer through conductive via holes;
    the conductive via holes penetrate through the second planarization layer, the reflection layer and the first planarization layer, and the first sub-electrodes are insulated from the reflection layer.

12. The array substrate of claim 11, wherein the conductive via holes comprise:
third via holes penetrating through the reflection parts,
fourth via holes penetrating through the second planarization layer, and
fifth via holes penetrating through the first planarization layer;
in a same conductive via hole, an orthographic projection of the fourth via hole on the base substrate and an orthographic projection of the fifth via hole on the base substrate are located in an orthographic projection of the third via hole on the base substrate, and the orthographic projection of the fourth via hole on the base substrate overlaps with the orthographic projection of the fifth via hole on the base substrate, and an insulating material is filled between the fourth via hole and the third via hole.

13. The array substrate of claim 12, wherein the orthographic projection of the pixel defining layer on the base substrate covers orthographic projections of the fourth via holes on the base substrate.

14. The array substrate of claim 13, wherein in the same sub-pixel, some of the fourth via holes are located on the first side of the first sub-electrodes, and remaining fourth via holes are located on the second side of the first sub-electrodes.

15. The array substrate of claim 11, wherein materials of the reflection layer comprise a metal material and an ink material.

16. An array substrate, comprising:
a base substrate comprising:
a plurality of sub-pixels;
wherein at least one of the plurality of sub-pixels comprises:
an active layer on a side of the base substrate;
a gate insulating layer on a side of the active layer away from the base substrate;
a gate on a side of the gate insulating layer away from the base substrate;
an interlayer insulating layer on a side of the gate away from the base substrate;
a source-drain layer on a side of the interlayer insulating layer away from the base substrate;
a first planarization layer on a side of the source-drain layer away from the base substrate; and
an anode on a side of the first planarization layer away from the base substrate;
wherein the anode comprises:
a reflection layer, located on the side of the first planarization layer away from the base substrate and comprising a plurality of reflection parts arranged at intervals;
a second planarization layer, located on a side of the reflection layer away from the base substrate and covering the reflection layer and the base substrate;
a first transparent electrode layer, located on a side of the second planarization layer away from the base substrate and comprising a plurality of first electrodes arranged at intervals; wherein the first electrode comprises a plurality of first sub-electrodes arranged at intervals;
wherein there is at least an overlapping area between orthographic projections of the first electrodes on the base substrate and orthographic projections of the reflection parts on the base substrate in a same sub-pixel;
wherein the first sub-electrodes are electrically connected to a drain in the source-drain layer through conductive via holes;
the conductive via holes penetrate through the second planarization layer, the reflection layer and the first planarization layer, and the first sub-electrodes are insulated from the reflection layer.

17. The array substrate of claim 16, wherein the conductive via holes comprise:
third via holes penetrating through the reflection parts,
fourth via holes penetrating through the second planarization layer, and
fifth via holes penetrating through the first planarization layer;
in a same conductive via hole, an orthographic projection of the fourth via hole on the base substrate and an orthographic projection of the fifth via hole on the base substrate are located in an orthographic projection of the third via hole on the base substrate, and the orthographic projection of the fourth via hole on the base substrate overlaps with the orthographic projection of the fifth via hole on the base substrate, and an insulating material is filled between the fourth via hole and the third via hole.

18. The array substrate of claim 17, wherein the array substrate further comprises:
a pixel defining layer, located on a side of the first transparent electrode layer away from the base substrate;
wherein an orthographic projection of the pixel defining layer on the base substrate covers orthographic projections of the fourth via holes on the base substrate.

19. The array substrate of claim 18, wherein in the same sub-pixel, some of the fourth via holes are located on a first side of the first sub-electrodes, and remaining fourth via holes are located on a second side of the first sub-electrodes; wherein the first side is opposite to the second side.

20. The array substrate of claim 16, wherein materials of the reflection layer comprise a metal material and an ink material.

* * * * *